United States Patent
Kitayama et al.

(10) Patent No.: US 9,111,721 B2
(45) Date of Patent: Aug. 18, 2015

(54) ION BEAM DEVICE AND MACHINING METHOD

(75) Inventors: Shinya Kitayama, Tokyo (JP); Satoshi Tomimatsu, Tokyo (JP); Tsuyoshi Onishi, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 96 days.

(21) Appl. No.: 14/002,137

(22) PCT Filed: Jan. 13, 2012

(86) PCT No.: PCT/JP2012/050554
§ 371 (c)(1), (2), (4) Date: Aug. 29, 2013

(87) PCT Pub. No.: WO2012/132494
PCT Pub. Date: Oct. 4, 2012

(65) Prior Publication Data
US 2013/0334034 A1    Dec. 19, 2013

(30) Foreign Application Priority Data
Mar. 31, 2011   (JP) ................. 2011-078432

(51) Int. Cl.
H01J 37/20 (2006.01)
H01J 37/317 (2006.01)
H01J 37/22 (2006.01)

(52) U.S. Cl.
CPC ............ *H01J 37/317* (2013.01); *H01J 37/20* (2013.01); *H01J 37/222* (2013.01); *H01J 2237/30466* (2013.01); *H01J 2237/31745* (2013.01); *H01J 2237/31749* (2013.01)

(58) Field of Classification Search
USPC ............. 250/306, 307, 492.1, 492.2, 492.21, 250/492.22, 492.23, 492.3
See application file for complete search history.

(56) References Cited

U.S. PATENT DOCUMENTS 5,270,552 A    12/1993  Ohnishi et al.
2013/0032714 A1  2/2013  Kitayama et al.

FOREIGN PATENT DOCUMENTS

JP    60-126834    7/1985
JP    5-52721      3/1993
(Continued)

OTHER PUBLICATIONS

European Search Report for European Application No./Patent No. 12763892.2-1556 / 2696364 PCT/JP2012050554, issued on Aug. 5, 2014.
(Continued)

*Primary Examiner* — Nicole Ippolito
*Assistant Examiner* — Hanway Chang
(74) *Attorney, Agent, or Firm* — Baker Botts L.L.P.

(57) ABSTRACT

Provided are a device and method capable of machining a machining target such as a sample, a probe, or a sample table without requiring a high degree of device operation skill. First, a shape generation process of determining a shape of a machining target on the basis of an ion beam scanning signal and an absorption current of the machining target is performed. Next, a machining pattern positioning process of positioning a machining pattern over an image of the machining target is performed. Further, an ion beam stopping process of stopping ion beam irradiation is performed from a result of comparison between the image of the machining target and the machining pattern while the machining target is machined through the ion beam irradiation.

10 Claims, 18 Drawing Sheets

(56) References Cited

FOREIGN PATENT DOCUMENTS

| JP | 2000-171364 A | 6/2000 |
| JP | 2004-199969 A | 7/2004 |
| WO | WO 2011/129315 | 10/2011 |

OTHER PUBLICATIONS

JP Notice of Reasons for Rejection for Application No. 2011-078432, issued on Jul. 16, 2013.

ION BEAM DEVICE AND MACHINING METHOD

TECHNICAL FIELD

The present invention relates to an ion beam device with a function of machining a machining target using an ion beam, and an ion beam machining method.

BACKGROUND ART

A device for extracting a microsample from a sample substrate is proposed as a sample preparation device that facilitates preparation of a microsample piece used for analysis devices, by combining focused ion beam (hereinafter abbreviated to FIB) machining with micromanipulation technology. This technique is described in JP 5-52721 A. Such a sample preparation device employs a probe in a charged particle beam device. The sample preparation device separates the microsample for analysis from the sample substrate through FIB machining. Moreover, the microsample for analysis can be held and carried using the probe. The shape of the probe is recognized from a scanning ion microscope image (hereinafter referred to as a SIM image) through ion beam scanning and secondary electron detection.

Moreover, there is also a technique of recognizing the shape and the tip of a probe from an inflowing current image obtained by synchronizing an inflowing current of the probe with a scanning signal of a charged particle beam. Such a technique is described in JP 2000-171364 A.

There is also a method of, by disposing an extracted microsample on a sample table that is cylindrical or prismatic in shape, minimizing the sample contamination and ion beam damage generated during the FIB machining. Such a technique is described in JP 2004-199969 A.

CITATION LIST

Patent Literature

Patent Literature 1: JP 5-52721 A
Patent Literature 2: JP 2000-171364 A
Patent Literature 3: JP 2004-199969 A

SUMMARY OF INVENTION

Technical Problem

When a sample is machined with an ion beam device, it has been common to dispose a machining pattern based on a SIM image. Therefore, it has been impossible to automate the machining of the sample. For a needle-shaped sample table for mounting a microsample piece, it is desired that a sample contact plane of the sample table have about the same area as the bottom face of the sample. Therefore, an operator should shape the sample contact plane in accordance with the size of a microsample to be mounted. For machining of a sample, a sample table, and the like, it is necessary for an operator to operate an ion beam device and a drive mechanism. Therefore, the operator should have a high level of device operation skill.

It is an object of the present invention to provide a device and a method capable of machining a machining target such as a sample, a probe, or a sample table without requiring a high device operation skill.

Solution to Problem

According to the present invention, first, a shape generation process of determining a shape of a machining target on the basis of an ion beam scanning signal and an absorption current of the machining target is performed. Next, a machining pattern positioning process of positioning a machining pattern over an image of the machining target is performed. Further, an ion beam stopping process of stopping ion beam irradiation is performed from a result of comparison between the image of the machining target and the machining pattern while the machining target is machined through ion beam irradiation.

Advantageous Effects of Invention

According to the present invention, there is provided a device and a method capable of machining a machining target such as a sample, a probe, or a sample table without requiring a high degree of device operation skill.

DESCRIPTION OF EMBODIMENTS

Figure 1:
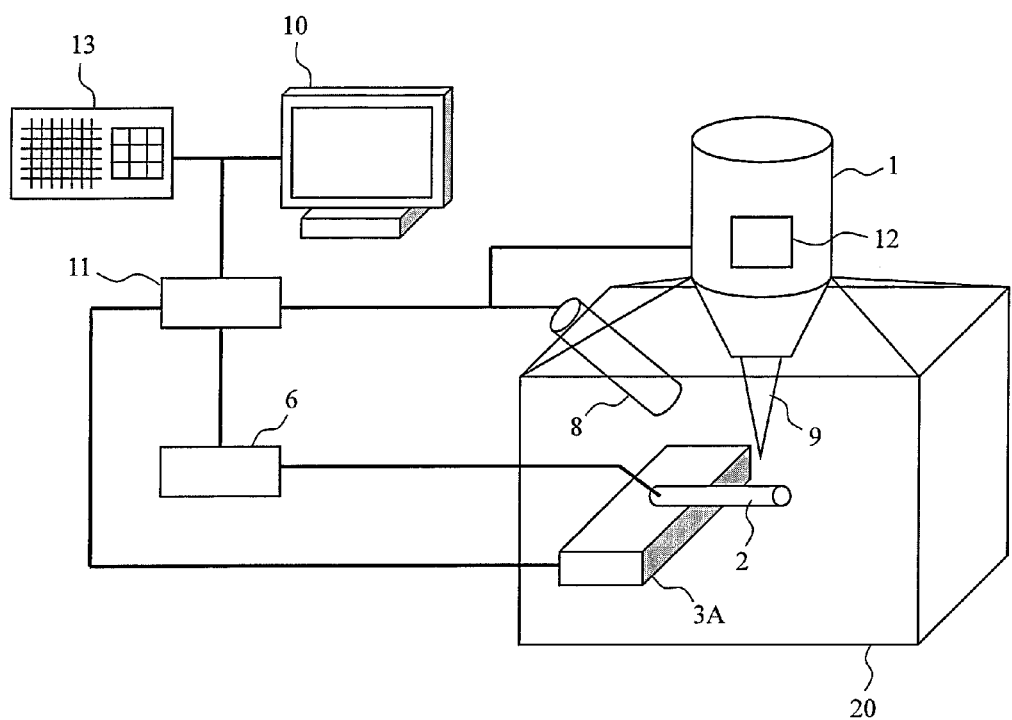
FIG. 1 is a diagram showing the overall schematic configuration of a first example of the ion beam device in accordance with the present invention.

FIG. 1 illustrates the basic configuration of a first example of an ion beam device in accordance with the present invention. The ion beam device in the present example includes an ion beam optical system 1 for irradiating a sample 2 with an ion beam 9, a sample stage 3A on which the sample 2 is mounted, an absorption current detection device 6 for detecting an absorption current of the sample 2, a secondary electron detection device 8 for detecting secondary electrons from the sample 2, a display device 10, an input device 13, and a central processing unit 11. The ion beam optical system 1 has a deflector 12 for scanning the sample 2 with the ion beam 9. The sample stage 3A is disposed in a sample chamber 20 that is evacuated to a vacuum, and can move a portion that should be machined or observed with the ion beam 9 to an ion beam irradiation position. By a secondary electron detection signal detected by the secondary electron detection device 8, an image is obtained and is displayed on the display device 10. The central processing unit 11 controls the ion beam optical system 1, the sample stage 3A, the display device 10, and the like.

The absorption current detection device 6 detects an absorption current of the machining target to detect the shape of the machining target. In the present example, the machining target is the sample 2 mounted on the sample stage 3A. Thus, the absorption current detection device 6 detects an absorption current of the sample 2. The absorption current detection device 6 amplifies the absorption current of the sample 2 to generate an absorption current detection signal, and transmits it to the central processing unit 11. The central processing unit 11 generates a sample image from the absorption current detection signal of the sample 2, and detects the tip position (coordinates) of the sample image. A machining pattern that has been registered in advance is positioned over the tip position of the sample image. The ion beam optical system 1 machines the tip of the sample on the basis of the machining pattern. According to the present example, in order to position the machining pattern, the image generated from the absorption current of the sample is used. Accordingly, the machining pattern can be positioned easily and accurately. However, a scanning ion microscope image (SIM image) may also be used to position the machining pattern.

Figure 2:
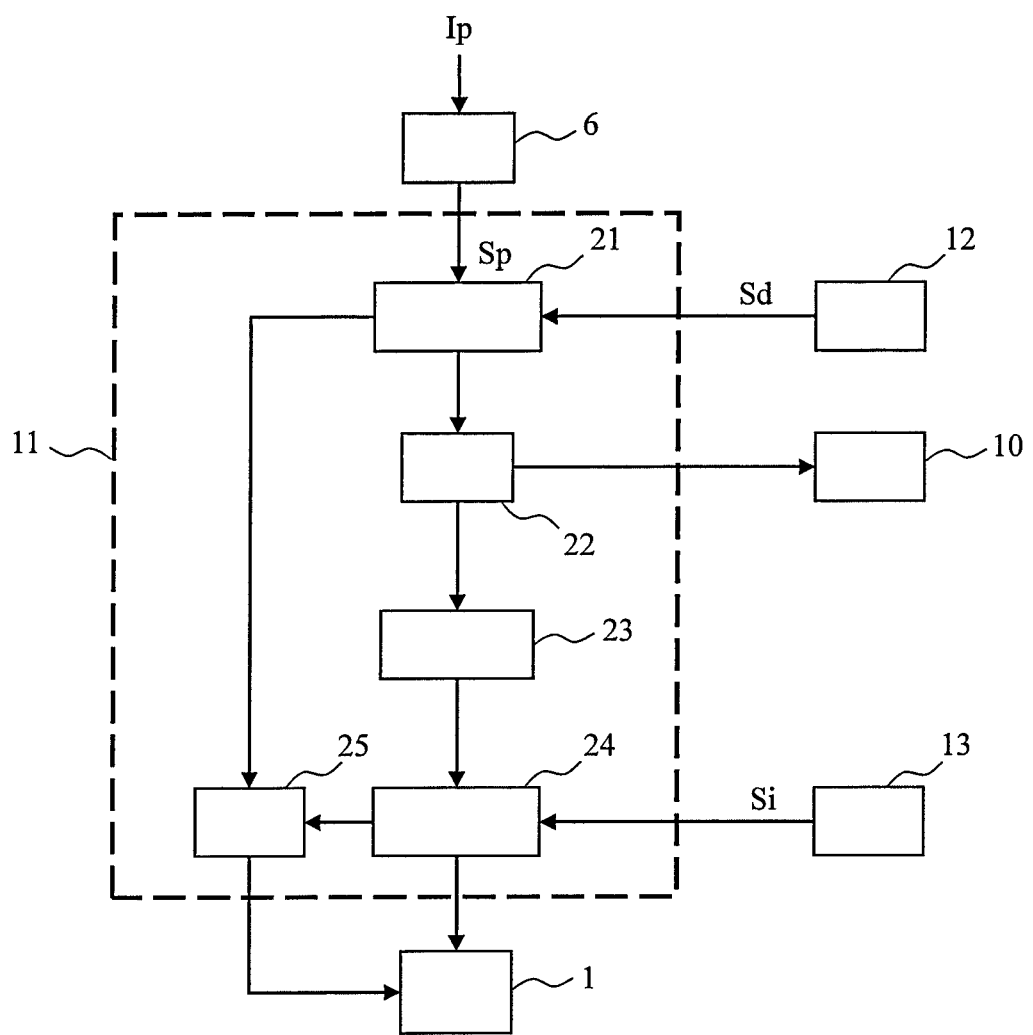
FIG. 2 is a functional block diagram for machining a sample with the ion beam device in accordance with the present invention.

With reference to FIG. 2, a process flow of the ion beam device of the present invention will be described. FIG. 2 is a block diagram including, among the components of the ion beam device, the absorption current detection device 6, the central processing unit 11, the deflector 12, the display device 10, the input device 13, and the ion beam optical system 1. The absorption current detection device 6 detects an absorption current (Ip) of the sample 2 and amplifies it to generate an image signal (Sp), and then supplies it to the central processing unit 11. The deflector 12 generates an ion beam scanning signal (Sd), and supplies it to the central processing unit 11. Machining pattern information (Si) is supplied to the central processing unit 11 via the input device 13. The machining pattern information (Si) may be input by an operator via the input device 13, but may also be stored in a memory in advance and read from the memory. The central processing unit 11 executes a sample shape generation process 21, a sample image storing process 22, a sample tip coordinate extraction process 23, a machining pattern positioning process 24, and an ion beam stopping process 25.

Figure 3A:
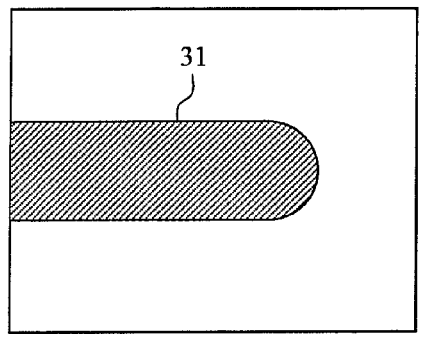
FIG. 3A is an illustration view of a sample machining procedure of the present invention.

With reference to FIGS. 3A to 3E, the process of the ion beam device of the present invention will be described. In the sample shape generation process 21, the shape of a sample is detected from the image signal (Sp) and the ion beam scanning signal (Sd). As shown in FIG. 1, a bottom of the sample chamber 20 is located below the tip of the sample 2. When the sample 2 is scanned with the ion beam 9, the sample chamber 20 located below the tip of the sample 2 is also scanned with the ion beam. When the sample 2 is being scanned with the ion beam 9, the absorption current detection signal (Ip) does not become zero. Thus, the image signal (Sp) does not become zero, and Sp is ≠0. When the ion beam 9 has passed over the sample 2 and is scanning the bottom of the sample chamber 20, the absorption current detection signal (Ip) becomes zero. Thus, the image signal (Sp) becomes zero, and Sp=0. By detecting the image signal (Sp), it is possible to determine whether the ion beam 9 is scanning the sample 2, or has passed over the sample 2 and is scanning the bottom of the sample chamber 20. By linking the points at which the image signal (Sp) changes from Sp is ≠0 to Sp=0, the outer shape of the sample 2 can be drawn. As a binarized image signal (Sp) is used in the present example, mixture of noise can be avoided. FIG. 3A illustrates a sample image 31 obtained by the sample shape generation process 21. The sample image 31 is obtained as the coordinates of the contour of the outer shape of the sample 2.

Next, in the sample image storing process 22, the sample image 31, which has been obtained in the sample shape generation process 21, is stored in a memory. The sample image 31 stored in the memory is displayed on the display device 10. It should be noted that the sample image 31 can also be directly displayed on the display device 10 without being stored in the memory.

Figure 3B:
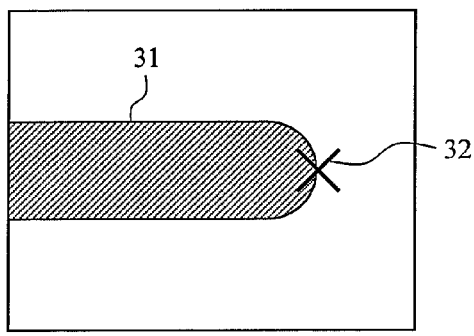
FIG. 3B is an illustration view of a sample machining procedure of the present invention.

In the sample tip coordinate extraction process 23, the position of a tip 32 of the sample image is detected from the sample image 31, and the coordinates thereof are read. A method of detecting the position (coordinates) of the tip 32 of the sample image from the sample image 31 will be described later. FIG. 3B illustrates a state in which the tip 32 of the sample image 31 is detected through the sample tip coordinate extraction process 23.

Figure 3C:
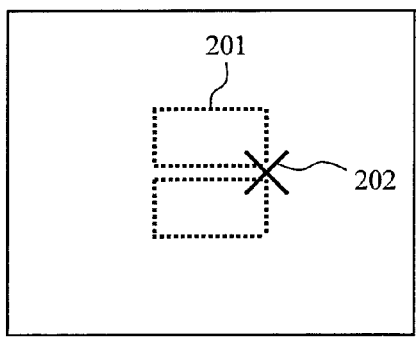
FIG. 3C is an illustration view of a sample machining procedure of the present invention.
Figure 3D:
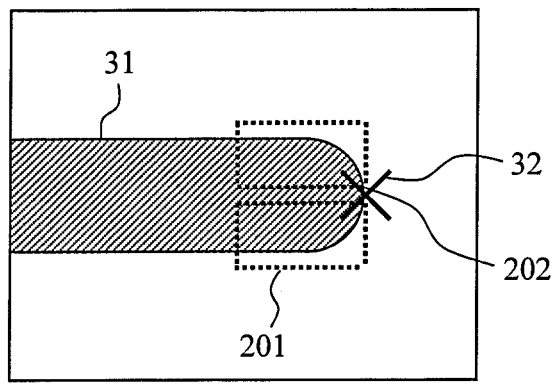
FIG. 3D is an illustration view of a sample machining procedure of the present invention.

In the machining pattern positioning process 24, the machining pattern 201 is positioned over the sample image 31. On the basis of the machining pattern information Si registered with the input device 13, a target point 202 of the machining pattern 201 is set. FIG. 3C illustrates the target point 202 of the machining pattern 201. The machining pattern 201 indicates a region of sample 2 to be removed through irradiation with the ion beam 9. The machining pattern 201 is positioned so that the positions (coordinates) of the target point 202 and the tip 32 of the sample image 31 coincide with each other. FIG. 3D illustrates a state in which the machining pattern 201 is positioned over the sample image 31.

Figure 3E:
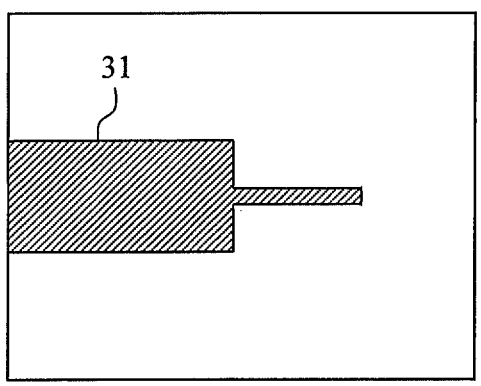
FIG. 3E is an illustration view of a sample machining procedure of the present invention.

The ion beam optical system 1 performs FIB machining on the basis of the machining pattern 201 set by the central processing unit 11. FIG. 3E illustrates an example of the tip of the sample obtained through the FIB machining. When a region of the machining pattern 201 is removed through the FIB machining, a sample image 31 with a shape that conforms to the machining pattern 201 registered in advance is obtained.

Next, the central processing unit 11 performs the ion beam stopping process 25. According to the present example, the ion beam stopping process 25 includes two cases. Hereinafter, examples of the ion beam stopping process 25 will be described.

Figure 4A:
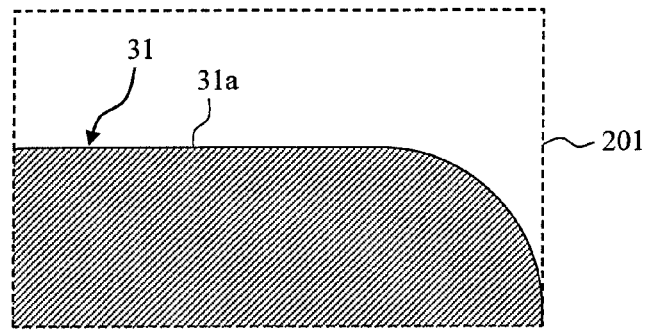
FIG. 4A is an illustration view of a first example of an ion beam stopping process of the sample machining of the present invention.
Figure 4B:
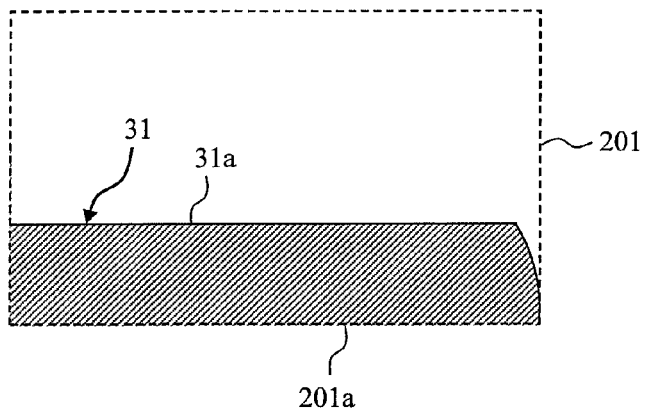
FIG. 4B is an illustration view of a first example of an ion beam stopping process of the sample machining of the present invention.
Figure 4C:
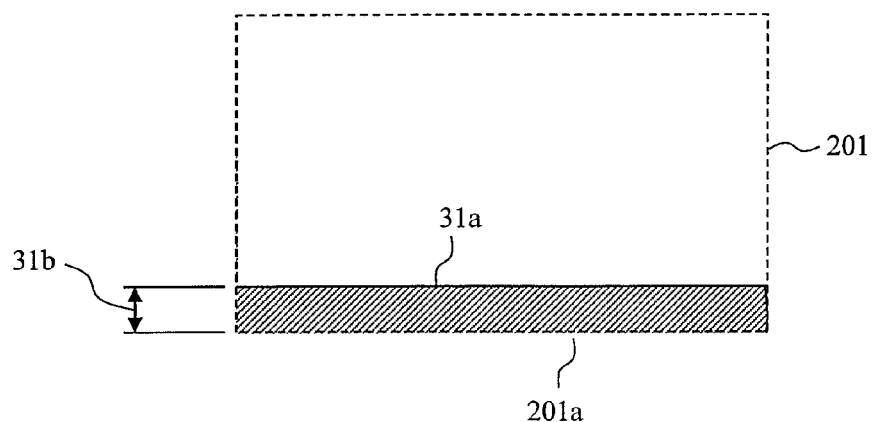
FIG. 4C is an illustration view of a first example of an ion beam stopping process of the sample machining of the present invention.

With reference to FIGS. 4A, 4B, and 4C, a first case of the ion beam stopping process 25 will be described. In the present example, the sample image 31 is monitored during the machining so that the outer shape of the sample image 31 is detected. A method of detecting the outer shape of the sample image 31 has been described with reference to the sample shape generation process 21. In this manner, the coordinates of the contour of the outer shape of the sample image 31 are obtained. The sample image 31 is compared with the machining pattern 201, and when the dimension between a long side of the inner side of the rectangle representing the machining pattern 201 and the outer shape of the sample image 31 has become smaller than a predetermined value, the ion beam irradiation is automatically stopped. FIG. 4A illustrates an outer shape 31a of the sample image 31 in the machining pattern 201 before the machining is started. FIG. 4B illustrates a state in which the outer shape 31a of the sample image is deformed through FIB machining. When FIB machining is performed, the dimension between a long side 201a of the inner side of the rectangle representing the machining pattern 201 and the outer shape 31a of the sample image becomes smaller. FIG. 4C illustrates a state in which the sample image has become smaller through the FIB machining, and the outer shape 31a of the sample image has changed. When the FIB machining progresses and the dimension 31b between the long side 201a of the inner side of the rectangle representing the machining pattern 201 and the outer shape 31a of the sample image has become smaller than a predetermined value, the ion beam irradiation is stopped.

In the present example, FIB machining is performed while monitoring the sample image 31. Thus, a portion corresponding to the machining pattern can be removed with high accuracy. However, in the present example, the shape and the position of the machining pattern are fixed. Therefore, when the sample image becomes smaller as shown in FIG. 4C, a space other than the region of the sample image in the machining pattern 201 becomes larger. In the FIB machining, the range of the machining pattern 201 is irradiated with the ion beam 9. That is, regardless of whether or not the sample 2 is present in the machining pattern 201, it is irradiated with the ion beam 9. Thus, in a region where the sample 2 is not present, irradiation with the ion beam 9 is wasted. Thus, in the following example, the machining pattern 201 is changed as the FIB machining progresses.

With reference to FIGS. 5A to 5D, a second case of the ion beam stopping process 25 will be described. In the present example, the sample image 31 is monitored during the machining so that the outer shape of the sample image 31 is detected. A method of detecting the outer shape of the sample image 31 has been described with reference to the sample shape generation process 21. In this manner, the coordinates of the contour of the outer shape of the sample image 31 are obtained. When the outer shape of the sample image 31 has changed, the machining pattern 201 is changed correspondingly. For example, the amount of change in the sample image 31 is measured, and when the change amount has reached a predetermined value, the machining pattern 201 may be modified. Accordingly, the machining pattern 201 changes in keeping with a change in the sample image 31. As the FIB machining progresses, the dimensions, in particular, the width of the machining pattern 201 becomes smaller. When the width of the machining pattern 201 has become smaller than the predetermined value, the ion beam irradiation is automatically stopped.

Figure 5A:
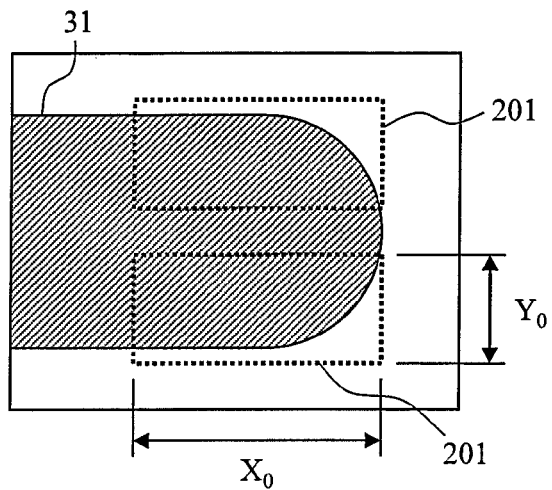
FIG. 5A is an illustration view of a second example of an ion beam stopping process of the sample machining of the present invention.
Figure 5B:
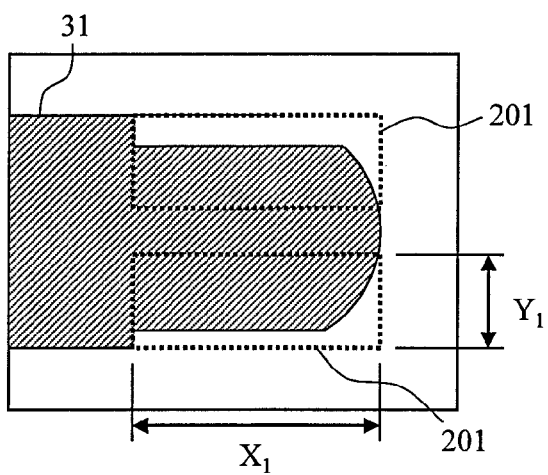
FIG. 5B is an illustration view of a second example of an ion beam stopping process of the sample machining of the present invention.
Figure 5C:
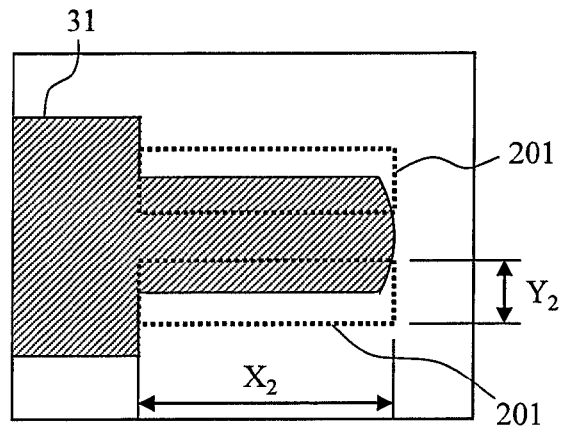
FIG. 5C is an illustration view of a second example of an ion beam stopping process of the sample machining of the present invention.
Figure 5D:
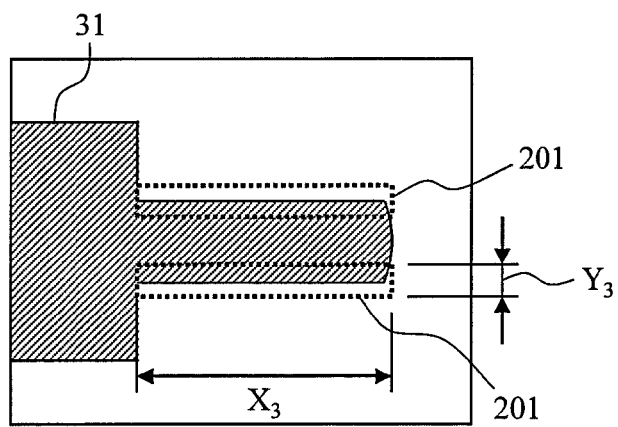
FIG. 5D is an illustration view of a second example of an ion beam stopping process of the sample machining of the present invention.

FIG. 5A illustrates the machining pattern 201 before the machining. It is assumed that the horizontal dimension and the vertical dimension of the machining pattern 201 are $X_0$ and $Y_0$, respectively. FIG. 5B illustrates the machining pattern 201 after the machining is started. The sample image 31 has become smaller, and further, the outer shape thereof has become flat. It is assumed that the horizontal dimension and the vertical dimension of the machining pattern 201 are $X_1$ and $Y_1$, respectively. Although the horizontal dimension $X_1$ of the machining pattern has not changed, the vertical dimension $Y_1$ thereof has become smaller. FIG. 5C illustrates the machining pattern 201 in a state in which the machining has further progressed. The sample image 31 has become further smaller. It is assumed that the horizontal dimension and the vertical dimension of the machining pattern 201 are $X_2$ and $Y_2$, respectively. Although the horizontal dimension $X_2$ of the machining pattern 201 has not changed, the vertical dimension $Y_2$ thereof has become further smaller. FIG. 5D illustrates the machining pattern 201 in a state in which the machining has further progressed. The sample image 31 has become further smaller. It is assumed that the horizontal dimension and the vertical dimension of the machining pattern 201 are $X_3$ and $Y_3$, respectively. Although the horizontal dimension $X_3$ of the machining pattern 201 has not changed, the vertical dimension $Y_3$ thereof has become extremely smaller. Thus, when the vertical dimension $Y_3$ of the machining pattern 201 has become smaller than a predetermined value, the ion beam irradiation is automatically stopped.

In the present example, when the machining has progressed and the sample image 31 has become smaller, the vertical dimension Y of the machining pattern 201 is reduced correspondingly. Of the two long sides of the machining pattern 201, the position of the inner long side is fixed, and the position of the outer long side is changed so that the proportion of the sample image 31 to the machining pattern 201 remains constant.

Figure 6:
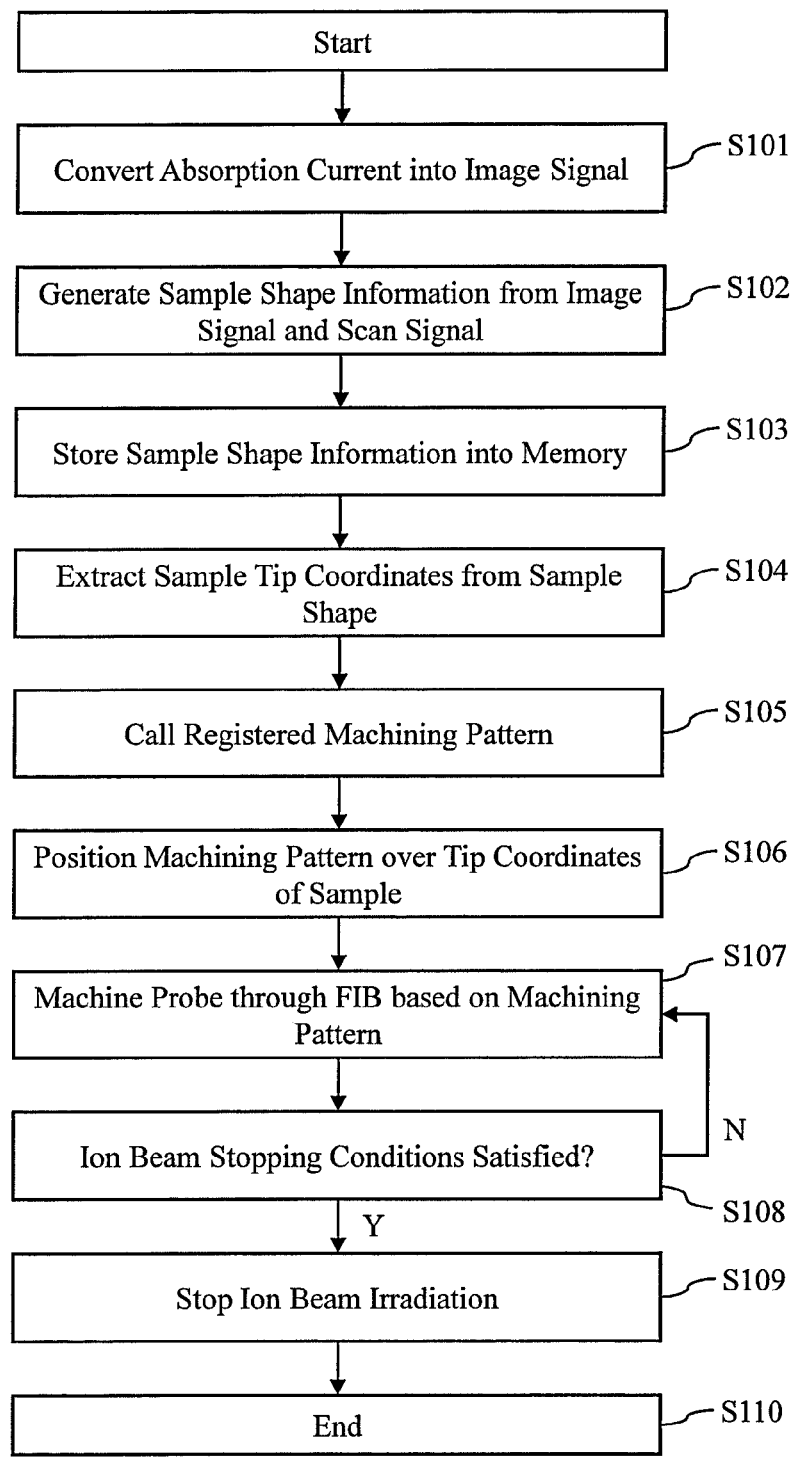
FIG. 6 is a flowchart showing a process flow of the sample machining in accordance with the present invention.

With reference to FIG. 6, a process of automatically machining a sample in accordance with the present invention will be described. In step S101, an absorption current of a sample is converted into an image signal. In step S102, the sample shape generation process 21 is executed. That is, sample shape information is generated from the image signal and the scanning signal. In step S103, the sample image storing process 22 is executed. That is, the sample shape information is stored in the memory. In step S104, the sample tip coordinate extraction process 23 is executed. That is, the coordinates of the tip of the sample are extracted from the sample shape information. In step S105, a registered machining pattern is called. In step S106, the machining pattern positioning process 24 is executed. That is, the machining pattern is positioned so that the coordinates of the tip of the sample coincide with the target point of the machining pattern. In step S107, the sample is subjected to FIB machining on the basis of the machining pattern. In step S108, it is determined if the ion beam irradiation should be stopped or not. As described above, the present example has two cases. When it is determined that the ion beam irradiation should be stopped, the process proceeds to step S109, and the ion beam stopping process 25 is performed.

According to the present invention, the automatic sample machining may also be performed by executing software with the central processing unit 11.

As described above, the ion beam device of the present example automatically executes the sample shape generation process 21, the sample image storing process 22, the sample tip coordinate extraction process 23, the machining pattern positioning process 24, and the ion beam stopping process 25. In the present example, it is possible to easily and accurately machine a sample at high speed without requiring a high degree of operation skill of an operator.

Further, when the sample is replaced with a probe, the sample stage is replaced with a probe driving device, and the machining pattern is replaced with a machining pattern for shaping the probe, it becomes possible to easily and surely shape the probe at high speed.

Figure 7:
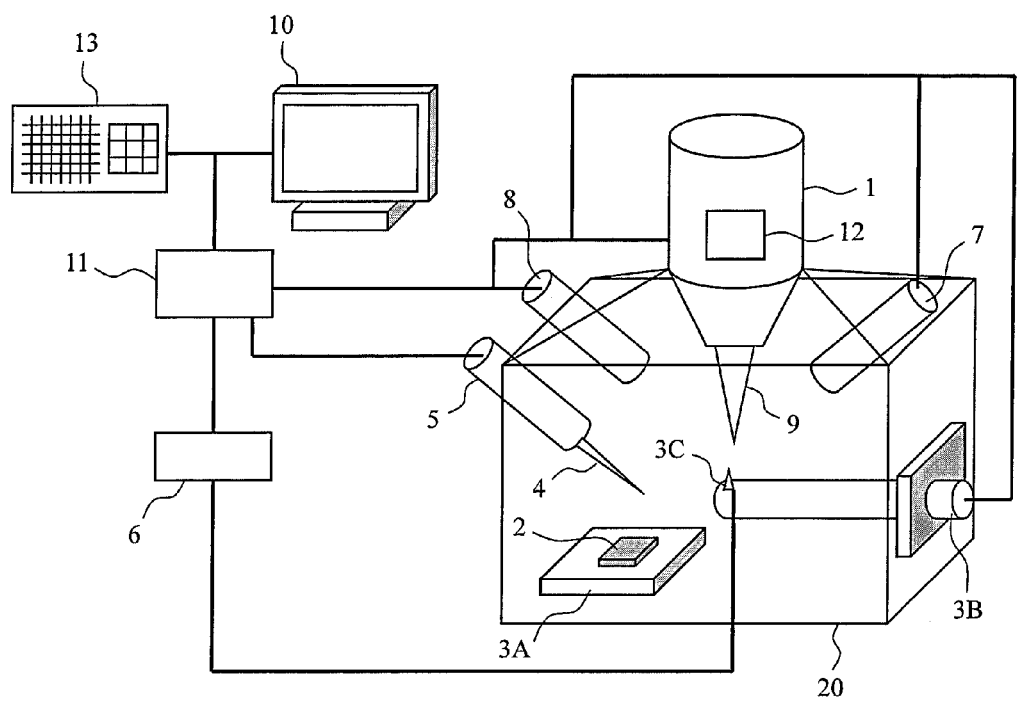
FIG. 7 is a diagram showing the overall schematic configuration of a second example of the ion beam device in accordance with the present invention.

FIG. 7 illustrates the basic configuration of a second example of the ion beam device in accordance with the present invention. The ion beam device in the present example differs from that of the first example shown in FIG. 1 in that it further includes a second sample stage 3B, a manipulator (a probe driving device) 5 with a probe 4, and a deposition gas source 7. The second sample stage 3B has a rotation axis, and has a needle-shaped sample table 3C mounted on the tip thereof. The rotation axis is capable of rotation about the central axis line as well as translatory movement. Thus, a sample mounted on the needle-shaped sample table 3C is capable of rotational movement as well as translatory movement.

The absorption current detection device 6 detects an absorption current of the machining target to detect the shape of the machining target. In the present example, the tip of the needle-shaped sample table 3C is machined. Thus, the absorption current detection device 6 detects an absorption current of the needle-shaped sample table 3C. It should be noted that when the shape of a sample attached to the tip of the needle-shaped sample table 3C is detected, an absorption current of the sample attached to the tip of the needle-shaped sample table 3C is detected. In addition, when the tip of the probe is machined, an abruption current of the probe is detected.

The manipulator (the probe driving device) 5 is configured to move the probe 4 to a given position. The deposition gas source 7 supplies gas for ion beam assisted deposition.

The ion beam device of the present example can extract (microsampling) a microsample including an observation portion by irradiating a sample with an ion beam.

Figure 8A:
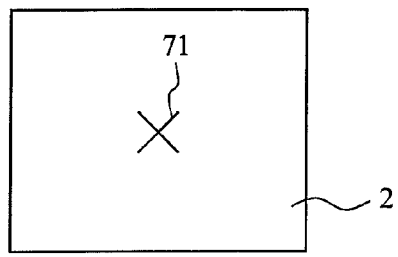
FIG. 8A is a view illustrating a step of irradiating a sample with an ion beam to extract a microsample including an observation portion using the ion beam device in accordance with the present invention.
Figure 8B:
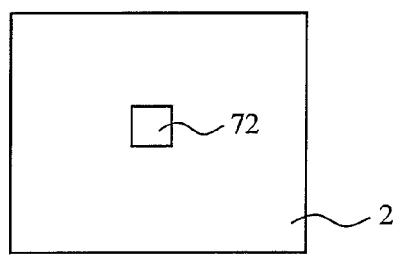
FIG. 8B is a view illustrating a step of irradiating a sample with an ion beam to extract a microsample including an observation portion using the ion beam device in accordance with the present invention.
Figure 8C:
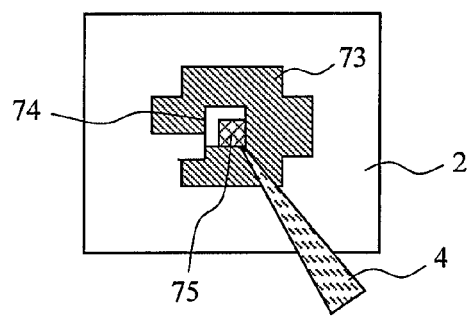
FIG. 8C is a view illustrating a step of irradiating a sample with an ion beam to extract a microsample including an observation portion using the ion beam device in accordance with the present invention.
Figure 8D:
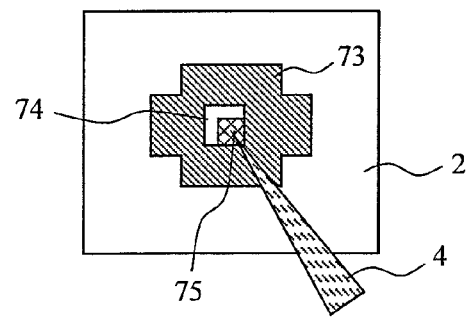
FIG. 8D is a view illustrating a step of extracting a microsample including an observation portion using the ion beam device in accordance with the present invention.
Figure 9A:
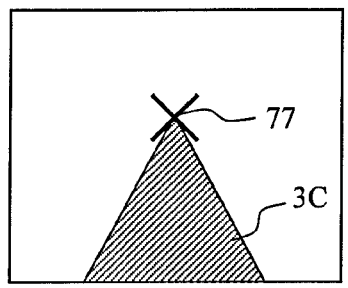
FIG. 9A is a view showing a step of machining the tip of a needle-shaped sample table using the ion beam device in accordance with the present invention.
Figure 9B:
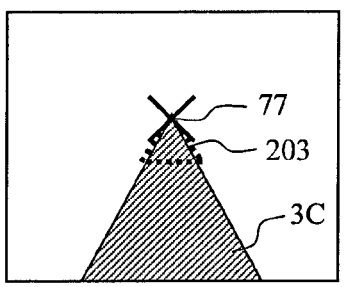
FIG. 9B is a view showing a step of machining the tip of a needle-shaped sample table using the ion beam device in accordance with the present invention.
Figure 9C:
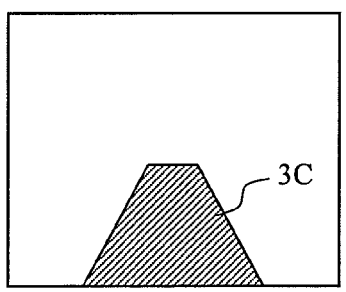
FIG. 9C is a view showing a step of machining the tip of a needle-shaped sample table using the ion beam device in accordance with the present invention.
Figure 10A:
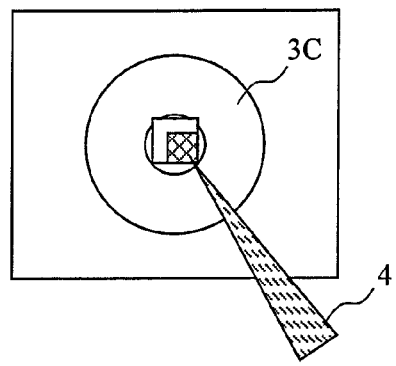
FIG. 10A is a view showing a step of fixing a microsample to the tip of a needle-shaped sample table using the ion beam device in accordance with the present invention.
Figure 10B:
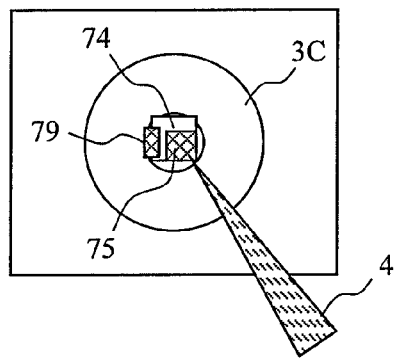
FIG. 10B is a view showing a step of fixing a microsample to the tip of a needle-shaped sample table using the ion beam device in accordance with the present invention.
Figure 10C:
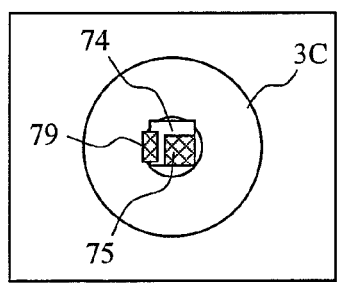
FIG. 10C is a view showing a step of fixing a microsample to the tip of a needle-shaped sample table using the ion beam device in accordance with the present invention.

With reference to FIGS. 8A to 8D, FIGS. 9A to 9C, and 10A to 10C, an example of microsampling that uses the ion beam device of the present example will be described. FIG. 8A to 8D illustrate steps of irradiating the sample 2 with the ion beam 9 to extract a microsample including an observation portion, FIGS. 9A to 9C illustrate steps of machining the tip of the needle-shaped sample table 3C, and FIGS. 10A to 10C illustrate steps of fixing the microsample to the tip of the needle-shaped sample table 3C. It should be noted that although such drawings represent images displayed on the display device 10, the same reference numerals as those of the sample, the needle-shaped sample table, and the probe are used for the sample image, the needle-shaped sample table image, the probe image, and the like for descriptive purposes. The description will be sequentially made below.

(1) FIG. 8A illustrates an observation portion 71 on a sample 2. The sample 2 mounted on the first sample stage 3A is moved so that the observation portion 71 of the sample 2 is aligned with the optical axis of the ion beam 9.

(2) As shown in FIG. 8B, a deposited film 72 is formed in a region including the observation portion 71 of the sample 2 through beam assisted deposition using the deposition gas source 7. This film functions as a protective film for a microsample to be extracted.

(3) As shown in FIG. 8C, the sample 2 is irradiated with an ion beam at least from two directions, so that a region around the observation portion 71 is trimmed with a part of the region left intact. Thus, a microsample 74 is formed. It should be noted that the microsample 74 is connected to the sample 2 via a partial connection portion in the surrounding area, and is not completely separated from the sample. At least a part of a groove 73 that is formed around the observation portion 71 is tilted with respect to the depth direction. Next, the tip of the probe 4 is brought into contact with or proximity to the microsample 74. Then, a deposited film 75 is formed on the microsample 74 so as to cover the tip of the probe 4 though beam assisted deposition, so that the microsample 74 and the probe 4 are connected.

(4) As shown in FIG. 8D, the connection portion between the sample 2 and the microsample 74 is removed through ion beam irradiation. The groove 73 is formed in such a manner such that it surrounds the observation portion 71. Thus, the microsample 74 is completely separated from the sample 2.

(5) As shown in FIG. 9A, the second sample stage 3B is rotated about the rotation axis to arrange the central axis line of the needle-shaped sample table 3C of the second sample stage 3B such that it is orthogonal to the optical axis of the ion beam 9. The coordinates of the tip 77 of the needle-shaped sample table 3C are detected. An exemplary method of detecting the coordinates of the tip 77 of the needle-shaped sample table 3C will be described later.

(6) As shown in FIG. 9B, a machining pattern 203 is positioned such that the target point of the machining pattern 203 coincides with the coordinates of the tip 77 of the needle-shaped sample table 3C. The machining pattern 203 will be described in detail later.

(7) As shown in FIG. 9C, the tip of the needle-shaped sample table 3C is removed with the ion beam 9 on the basis of the machining pattern 203. Then, a flat sample contact plane is formed at the tip of the needle-shaped sample table 3C.

(8) As shown in FIG. 10A, the second sample stage 3B is rotated about the rotation axis to arrange the central axis line of the needle-shaped sample table 3C of the second sample stage 3B such that it is aligned with the optical axis of the ion beam 9. The probe 4 is moved so that the microsample 74 connected to the tip of the probe 4 is made into contact with the sample contact plane of the needle-shaped sample table 3C.

(9) As shown in FIG. 10B, a deposited film 79 is formed through beam assisted deposition so that the microsample 74 is connected to the needle-shaped sample table 3C.

(10) As shown in FIG. 10C, the tip of the probe 4 is irradiated with the ion beam 9, so that the probe 4 is separated from the microsample 74.

Figure 11A:
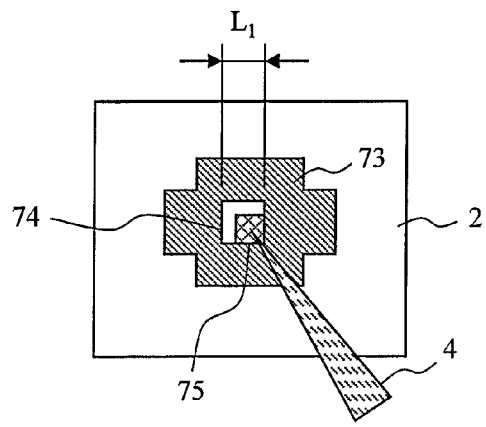
FIG. 11A is a view showing a state in which a microsample is extracted using the ion beam device in accordance with the present invention.
Figure 11B:
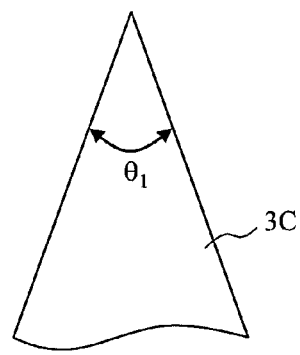
FIG. 11B is a view showing the tip of a needle-shaped sample table of the ion beam device in accordance with the present invention.
Figure 11C:
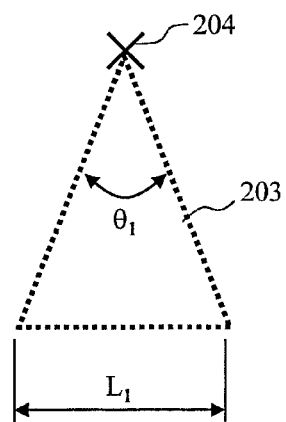
FIG. 11C is a view showing an exemplary machining pattern for a needle-shaped sample table in the ion beam device in accordance with the present invention.

With reference to FIGS. 11A, 11B, and 11C, the shape of a machining pattern used to machine the tip of the needle-shaped sample table 3C will be described. FIG. 11A illustrates a state in which the microsample 74 is extracted by trimming a region around the observation portion of the sample 2. The groove 73 is formed in such a manner that it surrounds the microsample 74. It is assumed that the length of one side of the micro sample 74 is L1. FIG. 11B illustrates the tip of the needle-shaped sample table 3C. It is assumed that the angle of the tip of the needle-shaped sample table 3C is θ1. FIG. 11C illustrates the machining pattern 203 for the needle-shaped sample table. The shape of the machining pattern is created using the dimension L1 of the microsample 74 and the angle θ1 of the tip of the needle-shaped sample table 3C. The position coordinates of the target point 204 of the machining pattern 203 are set. In the present example, the machining pattern 203 is triangular in shape. The vertex thereof may have either a pointed shape or a slightly trimmed shape. The dimension of the base of the triangle representing the machining pattern 203 is set on the basis of the dimension L1 of the microsample 74, but the dimension need not be identical to the dimension L1 of the microsample 74, and may be greater than the dimension L1 by a predetermined dimension.

The length L1 of one side of the microsample 74 is obtained from the machining data at the time of separating the microsample 74 including the observation portion from the sample 2 by irradiating the sample 2 with the ion beam 9. The length L1 of one side of the microsample 74 may be automatically input using such machining data, or be input by an operator. As the shape and the dimension of the needle-shaped sample table 3C are standardized, the angle θ1 of the tip of the needle-shaped sample table is constant.

Figure 12:
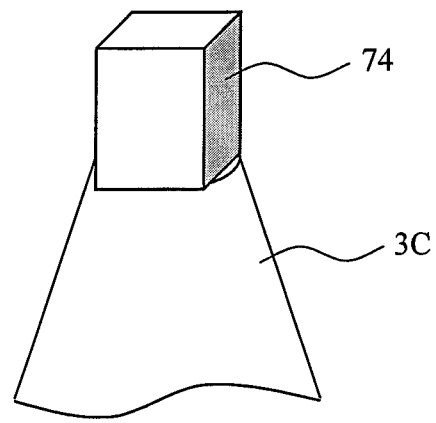
FIG. 12 is a perspective view showing a sample table having a sample mounted thereon in the ion beam device in accordance with the present invention.

FIG. 12 illustrates a state in which the microsample 74 is fixed on the sample contact plane of the tip of the needle-shaped sample table 3C. As the sample contact plane of the needle-shaped sample table 3C and the bottom face of the microsample 74 have about the same size, it is possible to prevent the needle-shaped sample table 3C from being sputtered by the ion beam and thus prevent contamination of the surface of the microsample 74. The microsample mounted on the needle-shaped sample table is thinned through focused ion beam (FIB) machining. The second sample stage having such a microsample mounted thereon is pulled out, and then the whole second sample stage is mounted on a transmission electron microscope or a scanning electron microscope. In this manner, high-resolution observation and element analysis in a microregion can be performed.

In the present example, machining of the tip of the needle-shaped sample table is performed automatically in accordance with the size of a microsample. Thus, the machining can be easily performed without requiring a high degree of operation skill.

In order to form a sample contact plane of the tip of the needle-shaped sample table 3C, a method that is similar to the method of machining the tip of the sample described with reference to FIGS. 2 and 3A to 3E is used. Hereinafter, the ion beam stopping process 25 performed when a sample contact plane of the tip of the needle-shaped sample table 3C is formed will be described.

Figure 13A:
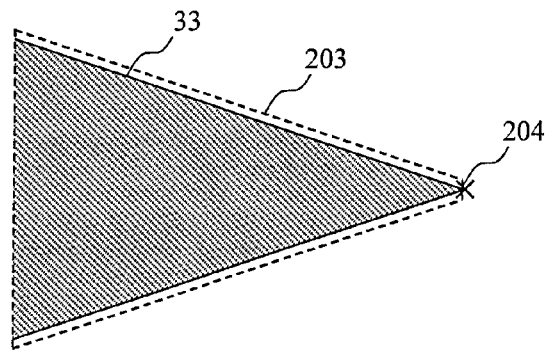
FIG. 13A is a view showing a state in which a machining pattern is positioned over a tip image of a needle-shaped sample table before the machining is started.
Figure 13B:
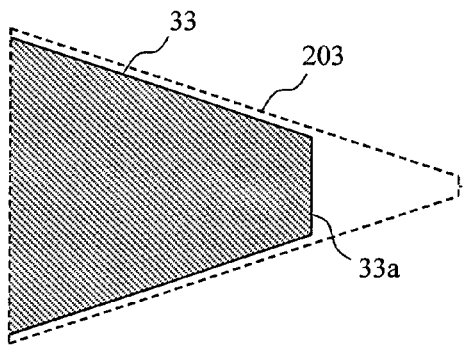
FIG. 13B is a view showing a state in which the vertex of the tip image of the needle-shaped sample table is trimmed through FIB machining with the ion beam device in accordance with the present invention.
Figure 13C:
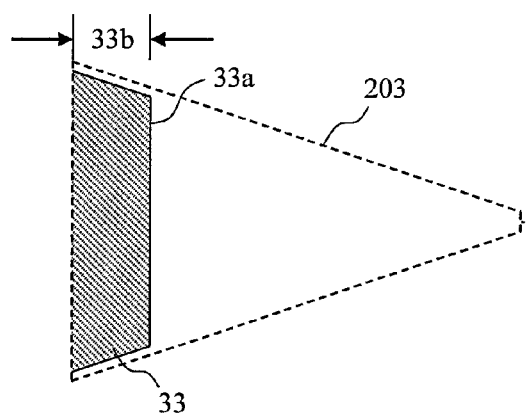
FIG. 13C is a view showing a state in which the tip image of the needle-shaped sample table is further reduced in size through FIB machining with the ion beam device in accordance with the present invention, with the vertex further trimmed.

With reference to FIGS. 13A, 13B, and 13C, a first case of the ion beam stopping process 25 performed when a sample contact plane of the tip of the needle-shaped sample table 3C is formed will be described. In the present example, a tip image of the needle-shaped sample table 3C that is being machined is monitored, and a tip image 33 is compared with the machining pattern 203, so that when the difference between the base of the triangle representing the machining pattern 203 and the outer shape of the tip of the sample image 31 has become smaller than a predetermined value, the ion beam irradiation is automatically stopped. FIG. 13A illustrates a state in which the machining pattern 203 is positioned over the tip image 33 of the needle-shaped sample table 3C before the machining is started. The machining pattern 203 is positioned so that the target point 204 of the machining pattern 203 coincides with the tip of the needle-shaped sample table 3C. FIG. 13B illustrates a state in which a vertex 33a of the tip image 33 of the needle-shaped sample table 3C is trimmed through FIB machining. When FIB machining is performed, the dimension between the base of the triangle representing the machining pattern 203 and the vertex 33a of the tip image 33 of the needle-shaped sample table 3C becomes smaller. FIG. 13C illustrates a state in which the tip image 33 of the needle-shaped sample table 3C becomes smaller through FIB machining, and the vertex 33a is further trimmed. As the FIB machining progresses and the dimension 33b between the base of the triangle representing the machining pattern 203 and the vertex 33a of the tip image 33 of the needle-shaped sample table 3C has become smaller than a predetermined value, the ion beam irradiation is stopped.

Figure 14A:
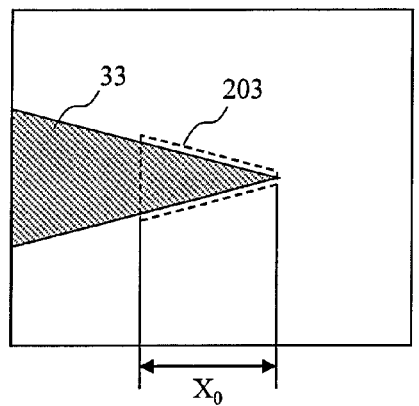
FIG. 14A is a view showing a machining pattern before the machining is performed with the ion beam device in accordance with the present invention.
Figure 14B:
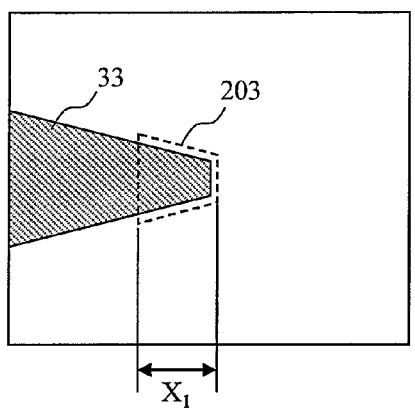
FIG. 14B is a view showing a machining pattern after the machining is started with the ion beam device in accordance with the present invention.
Figure 14C:
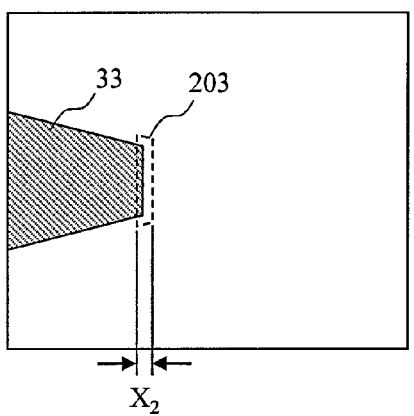
FIG. 14C is a view showing a machining pattern in a state in which the machining has progressed with the ion beam device in accordance with the present invention.

With reference to FIGS. 14A, 14B, and 14C, a second case of the ion beam stopping process 25 for when a sample contact plane of the tip of the needle-shaped sample table 3C is formed will be described. In the present example, the tip image 33 of the needle-shaped sample table 3C that is being machined is monitored, and when the tip image 33 has changed, the machining pattern 203 is changed correspondingly. As the FIB machining progresses, the dimensions, in particular, the width of the machining pattern 203 becomes smaller. When the width of the machining pattern 203 has become smaller than a predetermined value, the ion beam irradiation is automatically stopped.

FIG. 14A illustrates the machining pattern 203 before the machining. It is assumed that the horizontal dimension of the machining pattern 203 is $X_0$. FIG. 14B illustrates the machining pattern 203 after the machining is started. The tip image 33 of the needle-shaped sample table 3C is trimmed, and the tip thereof has become flat. It is assumed that the horizontal dimension of the machining pattern is $X_1$. Although the dimension of the base of the triangle representing the machining pattern has not changed, the horizontal dimension $X_1$ has become smaller. FIG. 14C illustrates the machining pattern 203 in a state in which the machining has further progressed. The tip image 33 of the needle-shaped sample table 3C has become further flatter. Although the dimension of the base of the triangle representing the machining pattern has not changed, the horizontal dimension $X_1$ has become extremely smaller. Thus, when the horizontal dimension $X_1$ of the machining pattern 201 has become smaller than a predetermined value, the ion beam irradiation is automatically stopped.

Figure 15A:
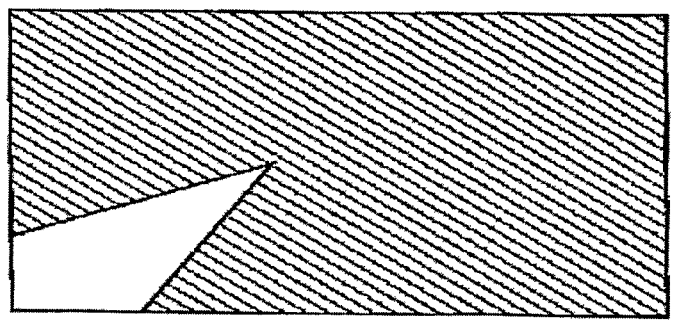
FIG. 15A is a view illustrating an exemplary method of detecting the tip of a machining target image.
Figure 15B:
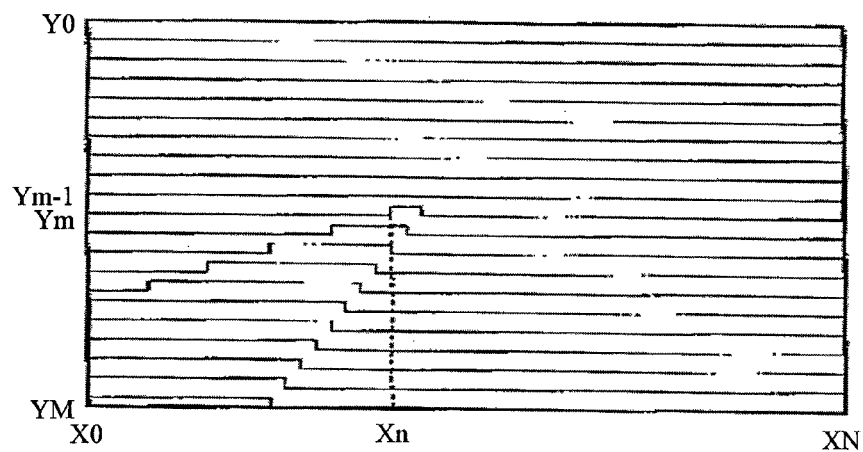
FIG. 15B is a view illustrating an exemplary method of detecting the tip of a machining target image.
Figure 15C:
FIG. 15C is a view illustrating an exemplary method of detecting the tip of a machining target image.

With reference to FIGS. 15A, 15B, and 15C, an exemplary method of detecting the tip of a sample image will be described. FIG. 15A illustrates a sample image displayed by a binarized (0 or 1) image signal Sp. The white portion represents a sample image, and the image signal therefor is Sp=1, while the dark portion does not represent a sample image, and the image signal therefor is Sp=0.

FIG. 15B is a view schematically showing the content of a memory in which the image of FIG. 15A is stored. This image includes N×M pixels. The coordinates of the image are represented by (Xi, Yj) (where i and j are integers). It should be noted that i=0 to N and j=0 to M. N denotes the number of digital divisions of the visual field in the X direction, and M denotes the number of digital divisions of the visual field in the Y direction.

FIG. 15C schematically illustrates a result of, for a predetermined Y, reading the image signal Sp along the X direction. The high level is Sp=1, and the low level is Sp=0. For example, in the range of Y=Y0 to Ym−1, the image signal is Sp=0 for all values of X. In the range of Y=Ym to YM, the image signal is Sp=1 for a given range of X. From such information, it is possible to detect the tip of the sample image. For example, it is possible to read the image signal Sp for each row in the range of Y=Y0 to Ym, so that a portion where the distance X between the rising edge (0→1) and the falling edge (1→0) is the smallest may be determined to be the tip. In the example shown in the drawing, the coordinates (Xn, Ym) are determined to be the tip coordinates of the sample image.

Figure 16A:
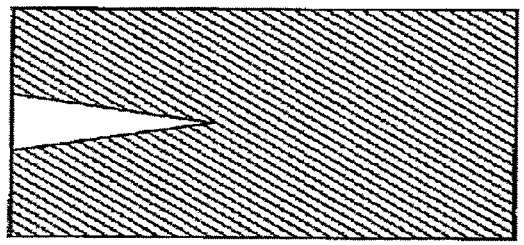
FIG. 16A is a view illustrating an exemplary method of detecting the tip of a machining target image.
Figure 16B:
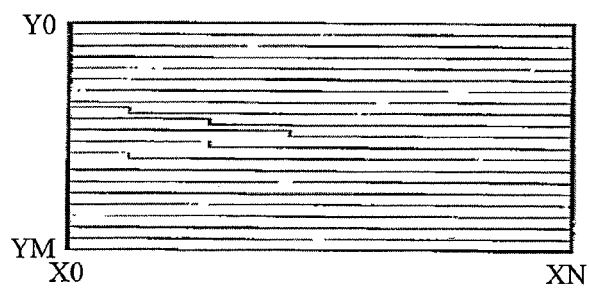
FIG. 16B is a view illustrating an exemplary method of detecting the tip of a machining target image.
Figure 16C:
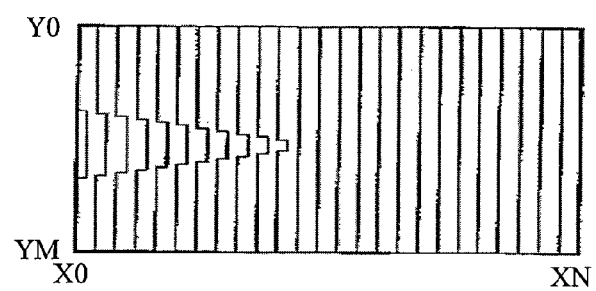
FIG. 16C is a view illustrating an exemplary method of detecting the tip of a machining target image.
Figure 16D:
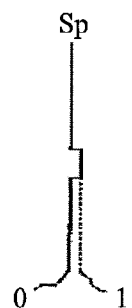
FIG. 16D is a view illustrating an exemplary method of detecting the tip of a machining target image.

As shown in FIG. 16A, when the sample image is horizontal, it would be impossible to detect the tip of the sample image with the aforementioned method. FIG. 16B schematically illustrates the content of a memory in which the image of FIG. 16A is stored. In this case, when the image signal Sp is read along the X direction for each Y value, it is possible to detect the rising edge (0→1) but it is impossible to detect the falling edge (1→0). Thus, as shown in FIGS. 16C and 16D, the image signal Sp may be read along the Y direction for each X value. When a portion where the distance Y between the rising edge and the falling edge is the smallest is extracted, such coordinates are the coordinates of the tip of the sample image.

A method of identifying the tip position of a sample image in the present example generates a sample image using an image signal (Sp) that is based on an absorption current detection signal (Ip). Thus, the image signal will never be Sp=1 in regions other than the sample image region. Therefore, a sample image can be obtained with high accuracy. Thus, in comparison with a case where a sample image is obtained from a SIM image through image pattern recognition, it is possible to obtain a sample image with higher accuracy.

In the present example, noise can be removed by binarizing the image signal Sp. However, when a singular point of Sp=1 is present in a region other than the sample image and it is thus impossible to detect the tip position with the aforementioned method, it will be possible to eliminate such singular point by performing smoothing by calculating the average between each pixel and the peripheral pixels thereof in relation to the whole pixels in the memory.

Although a case where the tip of a sample image is detected has been described, the same is true for a case where the vertex of the tip image of the needle-shaped sample table 3C is detected.

Although the aforementioned examples have described a case where a sample is machined and a case where the tip of the needle-shaped sample table 3C is machined, it is easily understood by one skilled in the art that the present invention can also be applied to a case where the tip of a probe is machined. In addition, although the aforementioned examples have described cases where an absorption current detection signal (Ip) is used to generate a machining pattern, it is also possible to use a scanning ion microscope image (a SIM image) instead of the abruption current detection signal (Ip).

Although the examples of the present invention have been described above, it is easily understood by those skilled in the art that the present invention is not limited to the aforementioned examples and various changes are possible within the scope of the invention recited in the appended claims.

REFERENCE SIGNS LIST

1 Ion beam optical system
2 Sample
3A First sample stage
3B Second sample stage
3C Needle-shaped sample table
4 Probe
5 Manipulator (Probe driving device)
6 Absorption current detection device
7 Deposition gas source
8 Secondary electron detector 9 Ion beam
10 Display device
11 Central processing unit
12 Deflector
13 Input device
20 Sample chamber
21 Sample shape generation process
22 Sample image storing process
23 Sample tip coordinate extraction process
24 Machining pattern positioning process
25 Ion beam stopping process
31 Sample image
31a Outer shape of sample image
31b Dimension
32 Tip of sample image
33 Tip image
71 Observation portion of sample
72 Deposited film
73 Machined groove
74 Mircosample
75 Deposited film
77 Tip of needle-shaped sample table
79 Deposited film
201 Machining pattern
202 Target point
203 Machining pattern
204 Target point

The invention claimed is:

1. An ion beam device comprising:
an ion beam optical system configured to irradiate a machining target with an on beam;
an absorption current detection device configured to detect an absorption current that flows through the machining target due to the ion beam irradiation;
a central processing unit configured to control the ion beam optical system;
a shape generation processing unit configured to obtain an image of the machining target on the basis of a scanning signal of the ion beam and the absorption current of the machining target;
a machining pattern positioning processing unit configured to position a machining pattern over the image of the machining target obtained by the shape generation processing unit; and
an ion beam stopping processing unit configured to stop the ion beam irradiation from a result of comparison between the image of the machining target and the machining pattern while the machining target is machined through the ion beam irradiation.

2. The ion beam device according to claim 1, wherein the ion beam stopping processing unit is configured to, when a dimension between an outer shape of the image of the machining target and an outer shape of the machining pattern has become smaller than a predetermined value, stop the ion beam irradiation.

3. The ion beam device according to claim 1, wherein the ion beam stopping processing unit is configured to change the outer shape of the machining pattern in accordance with a change in the outer shape of the image of the machining target, and, when a dimension of the machining pattern has become smaller than a predetermined value, stop the ion beam irradiation.

4. The ion beam device according to claim 1, further comprising a sample stage having a needle-shaped sample table to which a microsample is attachable, and a rotation axis that allows a rotational movement and a translatory movement of the needle-shaped sample table, wherein the machining target is a tip of the needle-shaped sample table.

5. The ion beam device according to claim 1, wherein the machining target is one of a sample, a sample table, or a probe.

6. An ion beam device comprising:
a sample stage configured to hold a sample;
an ion beam optical system configured to irradiate the sample with an ion beam;
an absorption current detection device configured to detect a current that flows through the sample due to the ion beam irradiation; and
a central processing unit configured to control the ion beam optical system, wherein
the central processing unit executes a sample shape generation process of detecting a shape of the sample on the basis of an abruption current detected by the absorption current detection device, a sample tip coordinate extraction process of detecting a tip position of the sample from the shape of the sample, a machining pattern positioning process of positioning a machining pattern over the shape of the sample obtained through the sample shape generation process, and an ion beam stopping process of stopping the ion beam irradiation from a result of comparison between the shade of the sample and the machining pattern while the sample is machined through the ion beam irradiation.

7. The ion beam device according to claim 6, wherein the ion beam stopping process includes:
monitoring the shape of the sample that is being machined;
comparing the shape of the sample with the machining patter; and
stopping the ion beam irradiation when a dimension between outer shapes of the machining patter and the sample has become smaller than a predetermined value.

8. The ion beam device according to claim 6, wherein the ion beam stopping process includes:
monitoring the shape of the sample that is being machined;
when the shade of the sample has changed, changing the machining pattern correspondingly; and
when a width of the machining pattern has become smaller than a predetermined value, stopping the ion beam irradiation.

9. The ion beam device according to claim 6, wherein the sample shape generation process includes generating a binarized image signal on the basis of the absorption current, and detecting the shape of the sample from the binarized image signal.

10. The ion beam device according to claim 6, wherein
the sample stage has a needle-shaped sample table to which a microsample is attachable,
the absorption current detection device detects a current that flows through the needle-shaped sample table due to the ion beam irradiation, and
the central processing unit executes a shape generation process of detecting a shape of a tip of the needle-shaped sample table on the basis of the abruption current detected by the absorption current detection device, a tip coordinate extraction process of detecting a tip position of the needle-shaped sample table on the basis of the shape of the needle-shaped sample table, a machining pattern positioning process of positioning a machining pattern over a needle-shaped sample table image obtained through the shape generation process, and an ion beam stopping process of stopping the ion beam irradiation from a result of comparison between the needle-shaped sample table image and the machining pattern.

* * * * *